United States Patent [19]

Suh

[11] Patent Number: 5,757,692

[45] Date of Patent: May 26, 1998

[54] SEMICONDUCTOR MEMORY DEVICE

[75] Inventor: Jung Won Suh, Ichon, Rep. of Korea

[73] Assignee: Hyundai Electronics Industries Co., Ltd., Rep. of Korea

[21] Appl. No.: 727,852

[22] Filed: Oct. 4, 1996

[30] Foreign Application Priority Data

Oct. 6, 1995 [KR] Rep. of Korea ............... 1995/34288

[51] Int. Cl.⁶ ................................................ G11C 11/24
[52] U.S. Cl. ........................... 365/149; 365/63; 365/51
[58] Field of Search ............................ 365/149, 63, 51, 365/230.03, 230.06, 230.04

[56] References Cited

U.S. PATENT DOCUMENTS

| | | | |
|---|---|---|---|
| 5,267,196 | 11/1993 | Talreja | 365/230.03 |
| 5,457,661 | 10/1995 | Tomita et al. | 365/233.5 |
| 5,546,349 | 8/1996 | Watanabe et al. | 365/230.04 |
| 5,608,668 | 3/1997 | Zagar | 365/149 |

*Primary Examiner*—A. Zarabian
*Attorney, Agent, or Firm*—Gary M. Nath; Nath & Associates

[57] ABSTRACT

The semiconductor memory device having a cell array of a folded bit line structure according to the present invention comprises main bit lines MB1 and MB2 and m sub-bit lines SB1$i$ and SB2$i$ ($1 \leq i \leq m$), which detect amplifiers connected to both ends of the main bit lines, respectively, two sub-bit line block selection switching means for connecting the main bit line with respective sub-bit lines according to a block selection signal SBi, and a main bit line separation switching means connected between the two sub-bit line block selection switching means, for dividing the main bit line into two equal parts according to a main bit line separation signal. The number of cells connected to the bit lines is increased and the number of whole detect amplifiers is decreased, which may reduce the size of the chip so as to reduce the fabricating costs of the memory product.

7 Claims, 8 Drawing Sheets

SEMICONDUCTOR MEMORY DEVICE

BACKGROUND OF THE INVENTION

1. Field of the Invention

The present invention relates to a semiconductor memory device having a folded bit line structure and more, particularly to a semiconductor memory device having a folded bit line structure and dividing one main bit line into two equal parts for the purpose of a bi-directional use.

2. Description of the Prior Art

Generally, one of the most important factors in a memory product is its fabricating cost. To reduce the cost, the promotion of yield and the adoption of a simple and economical fabricating process needs to be considered. Furthermore, an increase in the number of dies which are integrated in a wafer can be considered so as to reduce the cost, which may be generally realized by scaling-down the design rule in a design. The parts taking up too much space in a gigabit high integrated memory are cells and a detect amplifier. As the detect amplifiers increase in number in the same ratio with cells according to the increase in a memory integration, the size of a die can be reduced by decreasing the number of detect amplifiers out of components of a DRAM. For a method of attaining this object, applying a folded bit line structure is expected to become one of the core technologies of the next memory products.

FIG. 1 is a partial circuit diagram of a conventional DRAM having a folded bit line structure. As shown in FIG. 1, the whole bit line connected to a cell is divided into m sub-bit lines SBi and /SBi ($1 \leq i \leq m$). Respective sub-bit lines are connected to main bit lines MB, and MB by means of a switch transistor which is applied with a block selection signal BS of 'ON' and 'OFF'. Consequently, if a cell is accessed so as to read or write in a folded bit line structure as described above, only the block selection signal BS of the sub-bit lines connected to the cell is activated and connected to main bit lines MB and /MB, but the other sub-bit lines are separated from the main bit lines MA and \MA. The entire capacitor of the bit lines may not be increased during a sensing operation even if the total number of cells connected to the main bit lines through the sub-bit lines are increased in comparison with a single bit line structure. For this reason, the size of a die can be considerably reduced by increasing the number of cells connected to the bit lines and decreasing the number of detect amplifiers used in a whole memory chip. In general, the resistance and the capacitor of a sub-bit line which is made of tungsten-polycide (WPolycide; $WSi_2$+Polysilicon) are large and those of a main bit line which is made of a metal wire are small, so that it is possible to maintain a sensing velocity during a read/write operation.

FIG. 2 is a partial circuit diagram of another conventional DRAM having a folded bit line structure which is applied in a 256 MB DRAM of Mitsubishi. A cell array consists of an open bit line structure. 32 sub-bit lines which are connected to 32 cells are connected to a main bit line by means of a block selection signal (BSi, $1 \leq i \leq m$). 1024 cells are consequently connected to the main bit line, so that the number of cells connected to the main bit line can be increased in comparison with the conventional single bit line structure of FIG. 1 (in general, 128 cells are connected to each bit line in a conventional single bit line structure). Moreover, as the main bit line consists of MB1*a* and MB1*b*, and MB2*a* and MB2*b* in a folded form, it is possible to solve the problem of noise of an open bit line to a certain degree.

In the case of applying a conventional folded bit line structure to a memory product, however, the fabricating process is difficult and yield may be reduced because the width and the space of a main bit line being made of a metal wire must be fabricated to have a minimum feature size.

SUMMARY OF THE INVENTION

Accordingly, the present invention is directed to a semiconductor memory device that substantially obviates one or more of the problems due to limitations and disadvantages of the related art.

An object of the present invention is to provide a semiconductor memory device by which the fabricating cost of a memory product can be reduced due to reduced chip size, by increasing the number of cells connected to bit lines and decreasing the number of whole detect amplifiers.

Another object of the present invention is to provide a semiconductor memory device whose fabricating process is simplified by doubling the main bit line pitch.

Further another object of the present invention is to provide a semiconductor memory device whose power consumption is reduced by decreasing the number of main bit lines and dividing respective main bit lines into two equal parts for the purpose of a bi-directional use.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the semiconductor memory device having a cell array of a folded bit line structure according to an embodiment of the present invention, comprises:

main bit lines MB1 and MB2 and m sub-bit lines SB1*i* and SB2*i* ($1 \leq i \leq m$);

detect amplifiers connected to both ends of the main bit line, respectively;

two sub-bit line block selection switching means for connecting the main bit line with respective sub-bit lines according to a block selection signal SBi; and a main bit line separation switching means connected between the two sub-bit line block selection switching means, for dividing the main bit line into two equal parts according to a main bit line separation signal.

Another embodiment of the present invention comprises:

main bit lines MB1 and MB2 and m sub-bit lines SB1*i* and SB2*i*;

detect amplifiers connected to both ends of the main bit line, respectively;

two sub-bit line block selection transistors connecting the main bit line with respective sub-bit lines according to a block selection signal BSi; and two series-connected main bit line separation transistor connected between the two sub-bit line block selection transistors, for dividing the main bit line into two parts according to a main bit line separation signal MBSn.

Furthermore, the sub-bit line block selection transistor which are located in each end of the main bit line and the sub-bit line and main bit line separation transistor are formed by ones.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the drawings.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
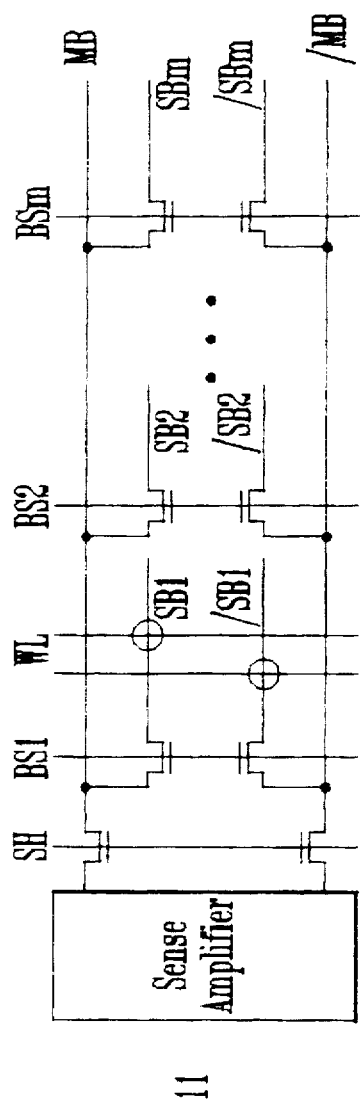
FIG. 1 is a partial circuit diagram of a conventional DRAM having a folded bit line structure.
Figure 2:
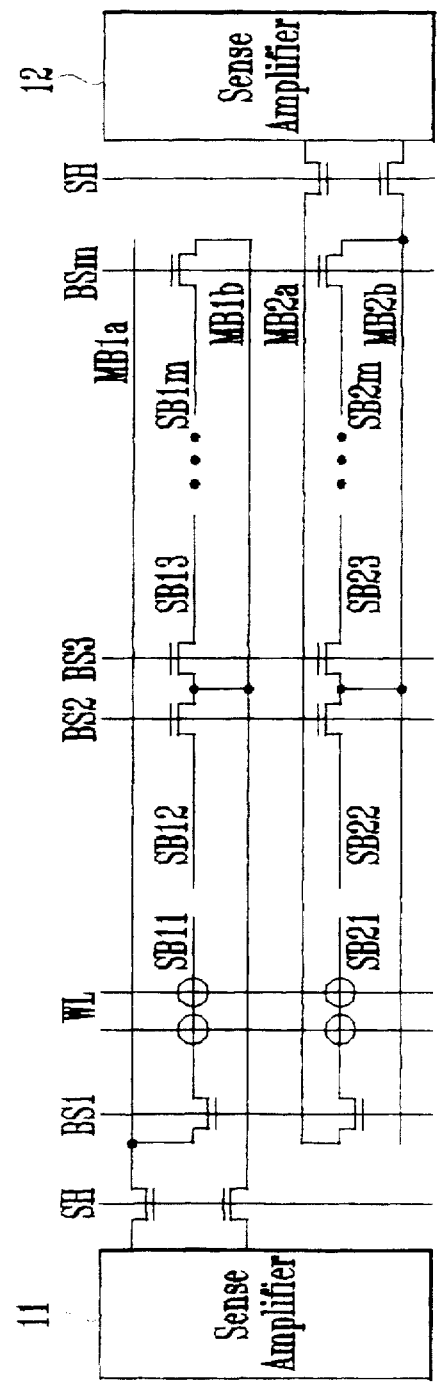
FIG. 2 is a partial circuit diagram of another conventional DRAM having a folded bit line structure.
Figure 3A:
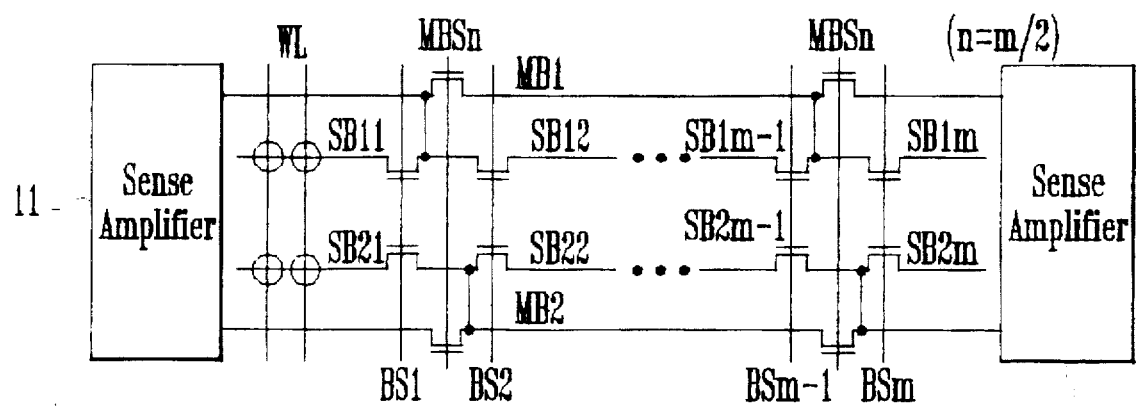
FIG. 3A is a partial detailed circuit diagram of the DRAM according to a first embodiment of the present invention.

In the first embodiment of the present invention as shown in FIG. 3A, m sub-bit lines SB1$i$ and SB2$i$ are respectively connected to main bit lines MB1 and MB2 through a switching transistor (=a sub-bit line block selection transistor) which are controlled by a block selection signal BSi (1≦i≦m). Another switching transistor(a main bit line separation transistor) whose operation is controlled by a main bit line separation signal MBSj (1≦j≦n) is located between the two sub-bit line blocks and acts as a switch for dividing the main bit line into two equal parts. n(=m/2) numbers of these switching transistors are needed for m sub-bit lines because they are arranged between the two sub-bit line blocks.

Figure 3B:
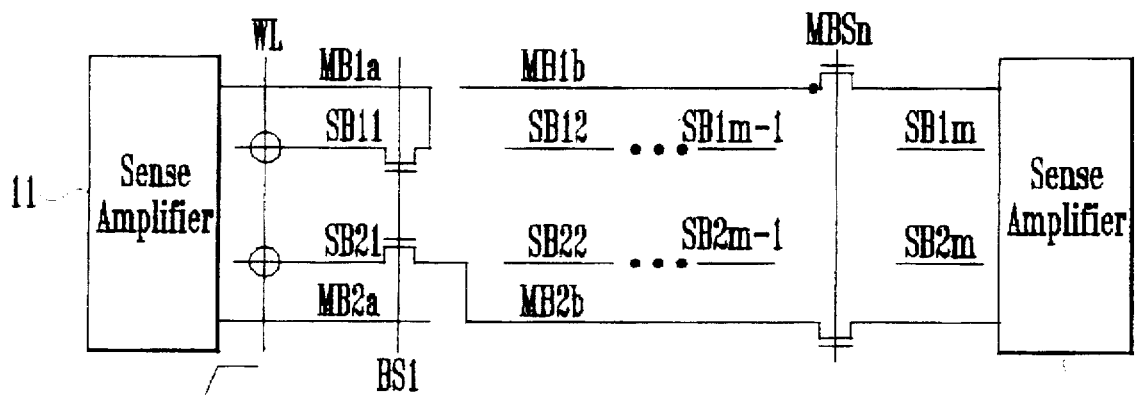
FIGS. 3B and 3C are operational illustrations of the DRAM as illustrated in FIG. 3A.
Figure 3C:
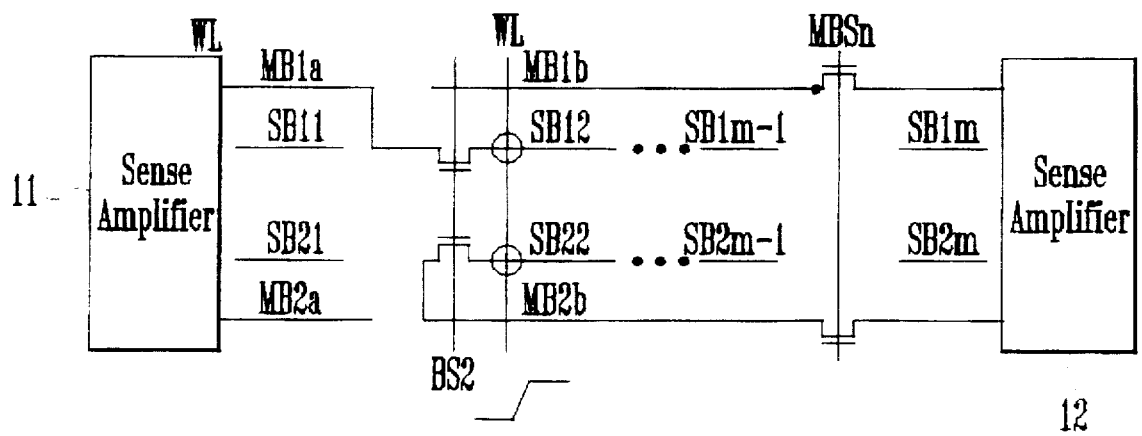

FIGS. 3B and 3C are operational illustrations of the DRAM as illustrated in FIG. 3A.

FIG. 3B is an illustration for an operation in case of reading or writing the cell of the sub-bit lines SB11 and SB21, and FIG. 3C is an illustration for an operation in case of access to the cell of the sub-bit lines SB12 and SB22.

As shown in FIG. 3B, when the cell of the sub-bit lines SB11 and SB21 is accessed, only a block selection signal (BS1) is activated from 'ground' to 'high voltage Vpp' before the activation of a word line and all the other block selection signals (BSi, 2≦i≦m) are kept at a precharged state, a ground voltage. Out of the main bit line separation signals MBSj which keep at 'Vpp' in a precharged state, only MBS1 signal changes from 'Vpp' to 'Vss' so as to divide the respective main bit lines MB1 and MB2 into two parts. Then, the sub-bit line SB11 is connected to the main bit line MB1$a$ and a detect amplifier 11 performs a detection with the main bit line MB2$a$ as a reference bit line. Similarly, the sub-bit line SB21 is connected to the main bit line MB2$b$ and a detect amplifier 12 performs a detection with the main bit line MB1$b$ as a reference bit line.

In FIG. 3C, when the cell of the sub-bit lines SB12 and SB22 is accessed, the sub-bit line SB12 is connected to the main bit line MB1$a$ and a detection is performed by the detect amplifier 11 with the main bit line MB2$a$ as a reference bit line. The sub-bit line SB22 is connected to the main bit line MB2$b$ and a detection is performed by the detect amplifier 12 with the main bit line MB1$b$ as a reference bit line. Even in the case of a write operation, the sub-bit lines are connected to the main bit lines as described above.

Figure 3D:
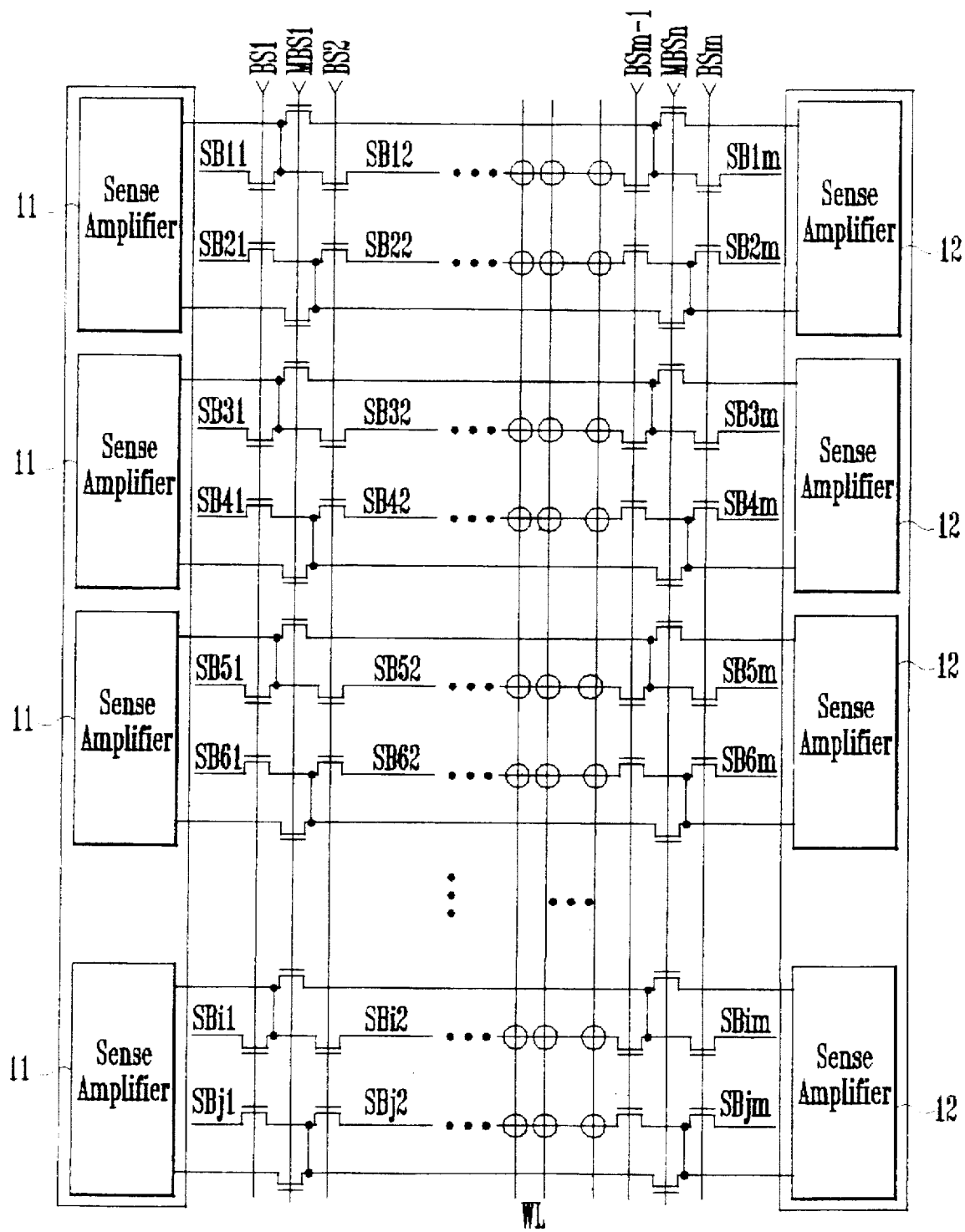
FIG. 3D is a detailed circuit diagram of the DRAM according to a first embodiment of the present invention.

FIG. 3D is a detailed circuit diagram of the DRAM according to a first embodiment of the present invention which applies a folded bit line structure to the whole cell array of an open bit line structure. As shown in the drawing, block selection signals (BSi, 1≦i≦m) and main bit line separation signals (MBSJ, 1≦j≦n) coexist so as to control respective sub-bit lines at the same time. For a simplification, a partial ward line is shown in the drawing.

Figure 4:
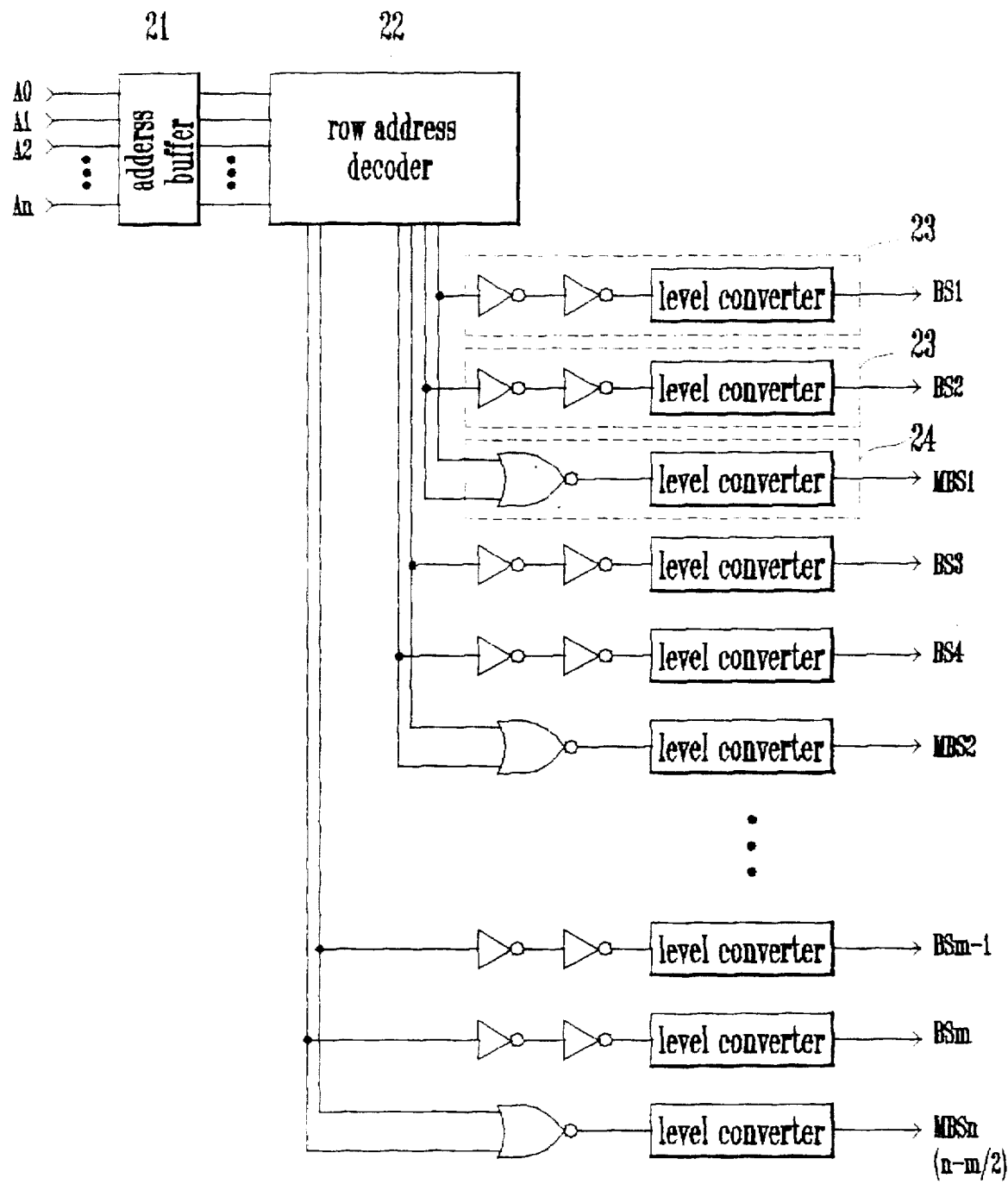
FIG. 4 is a diagram illustrating the generation of a block selection signal and a main bit line separation signal as shown in FIG. 3.

FIG. 4 is a circuit diagram illustrating the generation of a block selection signal BSi and a main bit line separation signal MBSj as shown in FIG. 3, which comprises:

an address buffer 21 for buffering a received address as an address pin;

a low address decoder 22 for decoding the buffered address signal from the address buffer 21;

at least two block selection signal generator 23 for transmitting the received signal from the low address decoder 22 to the gate of the sub-bit line block selection transistor through two series-connected inverters and a level converter; and at least one main bit line separation signal generator 24 for transmitting an output signal which is resulted from the two block selection signals of the low address decoder 22 as an NOR gate input to the gate of the main bit line separation transistor through the level converter.

In a read or a write operation, a low address is transferred from external address pins A0, A1, ... and An to the address buffer 21 and then decoded by the low address decoder 22. In this process, the block selection signal BSi which connects the sub-bit line having a cell connected to a ward line with the main bit line is activated to 'Vpp' before the activation of the ward line. The other block selection signals BSj (1≦j≦m, j≠i) remain in a ground state, so that all the remaining sub-bit lines are separated from the main bit lines. The main bit-line separation signal MBSi is generated by an input of the two block selection signals BSi into an NOR gate. Consequently, only the main bit line separation signal MBSi from the activated block selection signal BSi changes from 'Vpp' to 'Vss' and all the other main bit line separation signals MBSj (1≦j≦m/2, j≠i) remains at 'Vpp', so that the main bit lines are divided into two parts. In the above circuit diagram, all the block selection signals BSi (1≦i≦m) and the main bit line separation signals MBSi (1≦i≦n) are produced after passing the level converter (converting a 'high' signal, Vcc into Vpp) because they need a high voltage Vpp which is higher than an inner power voltage Vcc. If a low address changes, the output from a decoder will change. Thus, only the sub-bit lines having a cell connected to a ward line which will be addressed through this process can be connected to the main bit line and the main bit line which is divided into two parts.

Figure 5A:
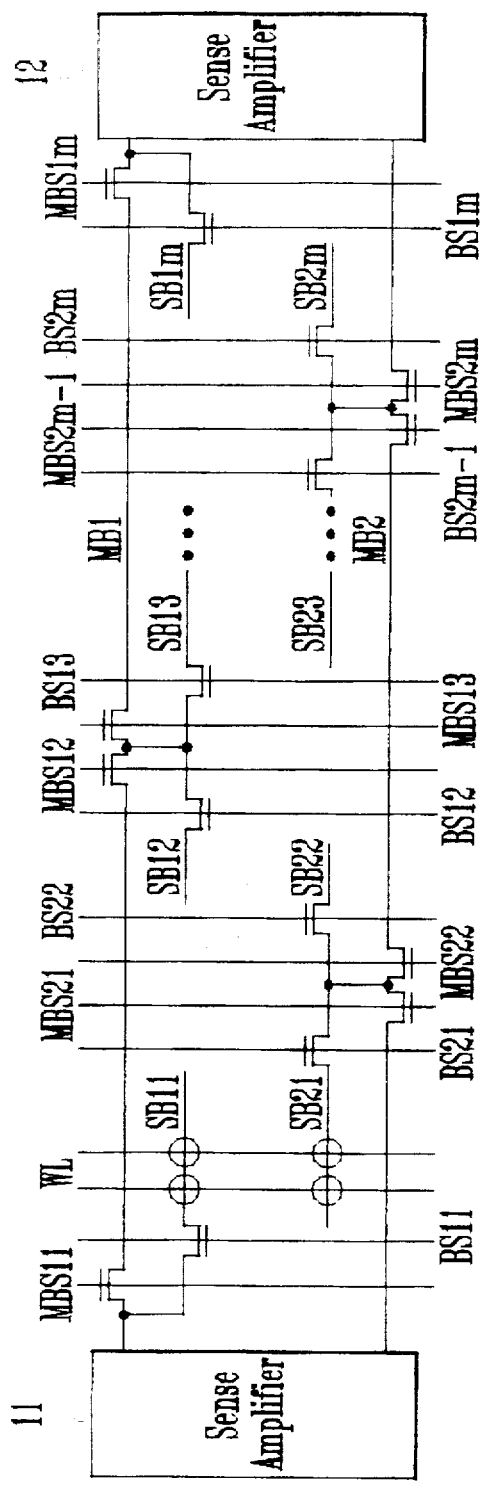
FIG. 5A is a partial detailed circuit diagram of the DRAM according to a second embodiment of the present invention.

FIG. 5A is a partial detailed circuit diagram of the DRAM according to a second embodiment of the present invention, which comprises:

main bit lines MB1 and MB2 and m sub-bit lines SB1m and SB2m;

detect amplifiers connected to both ends of the main bit line, respectively;

two sub-bit line block selection transistors connecting the main bit line with respective sub-bit lines according to a block selection signal BSi; and two series-connected main bit line separation transistor connected between the two sub-bit line block selection transistors, for dividing the main bit line into two parts according to a main bit line separation signal MBSn.

Furthermore, the sub-bit line block selection transistor which are located in each end of the main bit line and the sub-bit line and main bit line separation transistor are formed by ones.

In a cell array of an open bit line structure, m sub-bit lines SB1$i$ and SB2$i$ (1≦i≦m) are respectively connected to the main bit lines MB1 and MB2 through switching transistors (=sub-bit line block selection transistors) which are turned 'on' or 'off' by means of a block selection signals BS1$i$ and BS2$i$ (1≦i≦m). The two switching transistors (=main bit line separation transistors) which are controlled by main bit line separation signals MBS1$j$ and MBS2$j$ (1≦j≦m) are located between the two sub-bit line blocks alternately and act as a switch for dividing the main bit line into two equal parts.

Figure 5B:
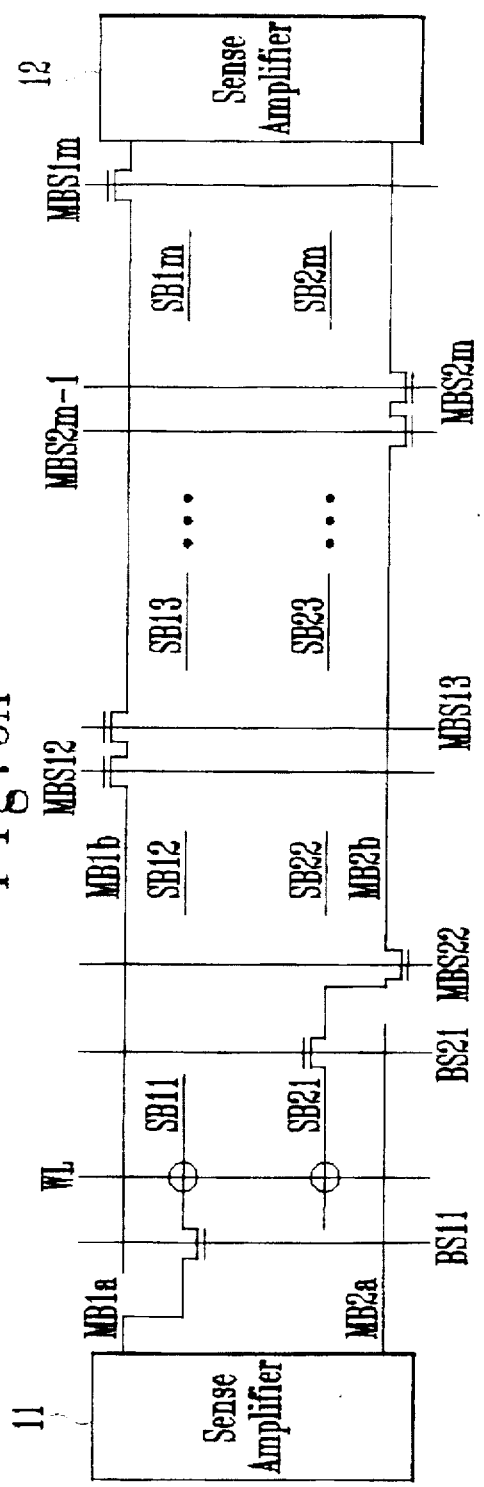
FIGS. 5B and 5C are operational illustrations of the DRAM as illustrated in FIG. 5A.
Figure 5C:
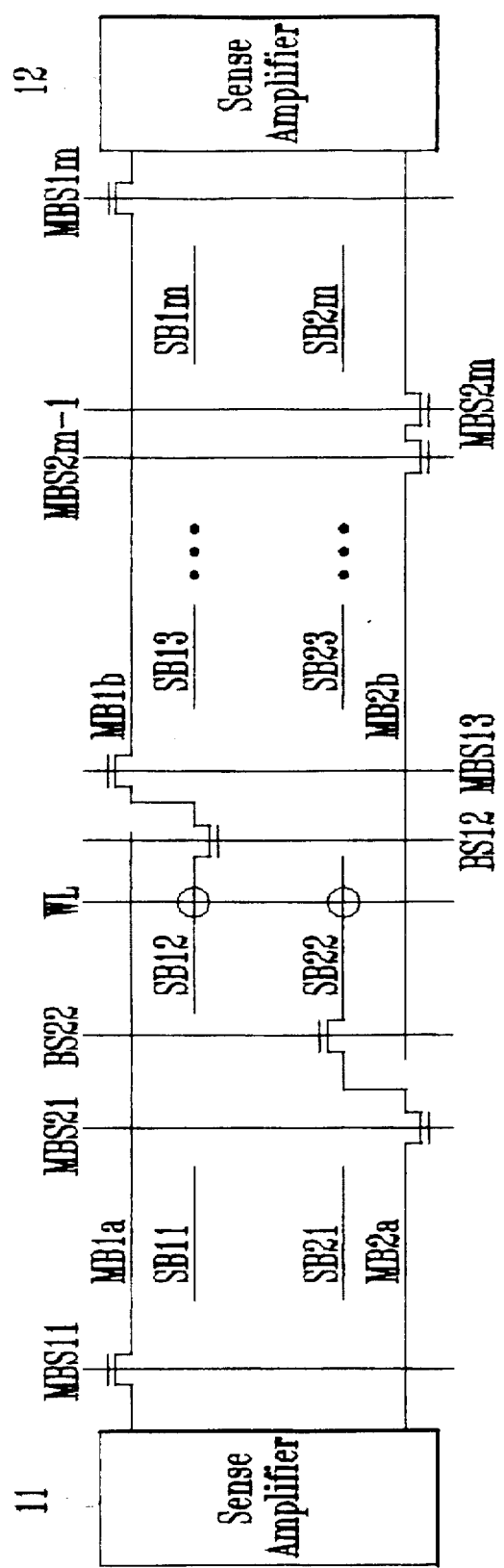

FIGS. 5B and 5C are operational illustrations of the DRAM as illustrated in FIG. 5A, which is a semiconductor memory device having a folded bit line structure according to the present invention.

FIG. 5B is an illustration for an operation in case of reading or writing the cell of the sub-bit lines SB11 and SB21, and FIG. 5C is an illustration for an operation in case of access to the cell of the sub-bit lines SB12 and SB22.

As shown in FIG. 5B, when the cell of the sub-bit lines SB11 and SB21 is accessed, only a block selection signal BS1 is activated from 'Vss' to 'Vpp' before the activation of a word line and all the other block selection signals BSi and BS2$i$ (2≦i≦m) are kept at a precharged state, 'Vss'. Out of the main bit line separation signals MBS1$i$ and MBS2$i$ which remain at 'Vpp' in a precharged state, only MBS21 signal changes from 'Vpp' to 'Vss' so as to divide the respective main bit lines MB1 and MB2 into two parts. Then, the sub-bit line SB11 is connected to the main bit line MB1$a$ and a detect amplifier 11 performs a detection with the main bit line MB2$a$ as a reference bit line. Similarly, the sub-bit line SB21 is connected to the main bit line MB2$b$ and a detect amplifier 12 performs a detection with the main bit line MB1$b$ as a reference bit line.

In FIG. 5C, when the cell of the sub-bit lines SB12 and SB22 is accessed, the sub-bit line SB12 is connected to the main bit line MB1$b$ and a detection is performed by the detect amplifier 11 with the main bit line MB2$b$ as a reference bit line. The sub-bit line SB22 is connected to the main bit line MB2$a$ and a detection is performed by the detect amplifier 12 with the main bit line MB1$a$ as a reference bit line. Even in case of a write operation, the sub-bit lines are connected to the main bit lines as described above.

Figure 5D:
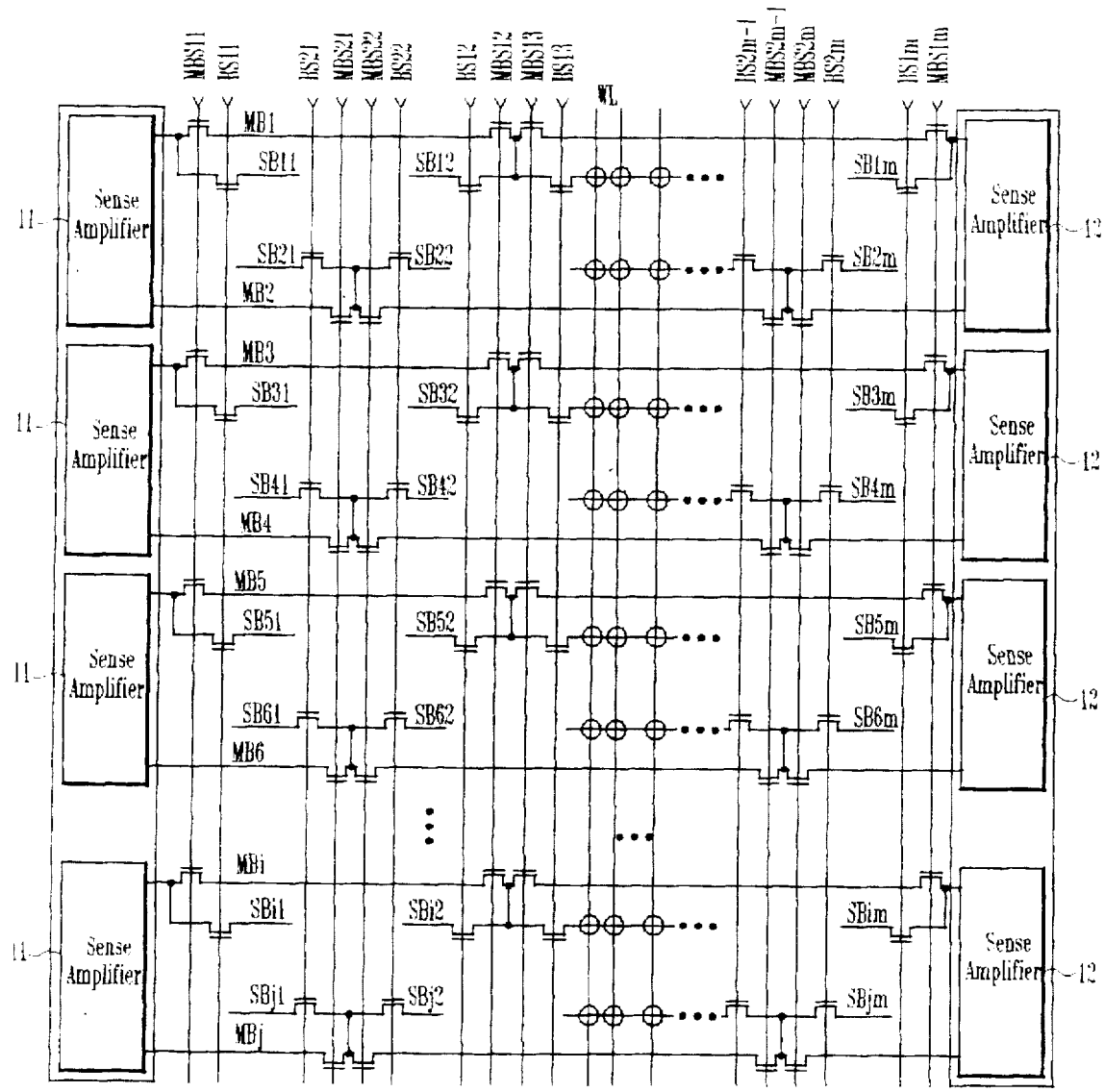
FIG. 5D is a detailed circuit diagram of the DRAM according to a second embodiment of the present invention.
Figure 6:
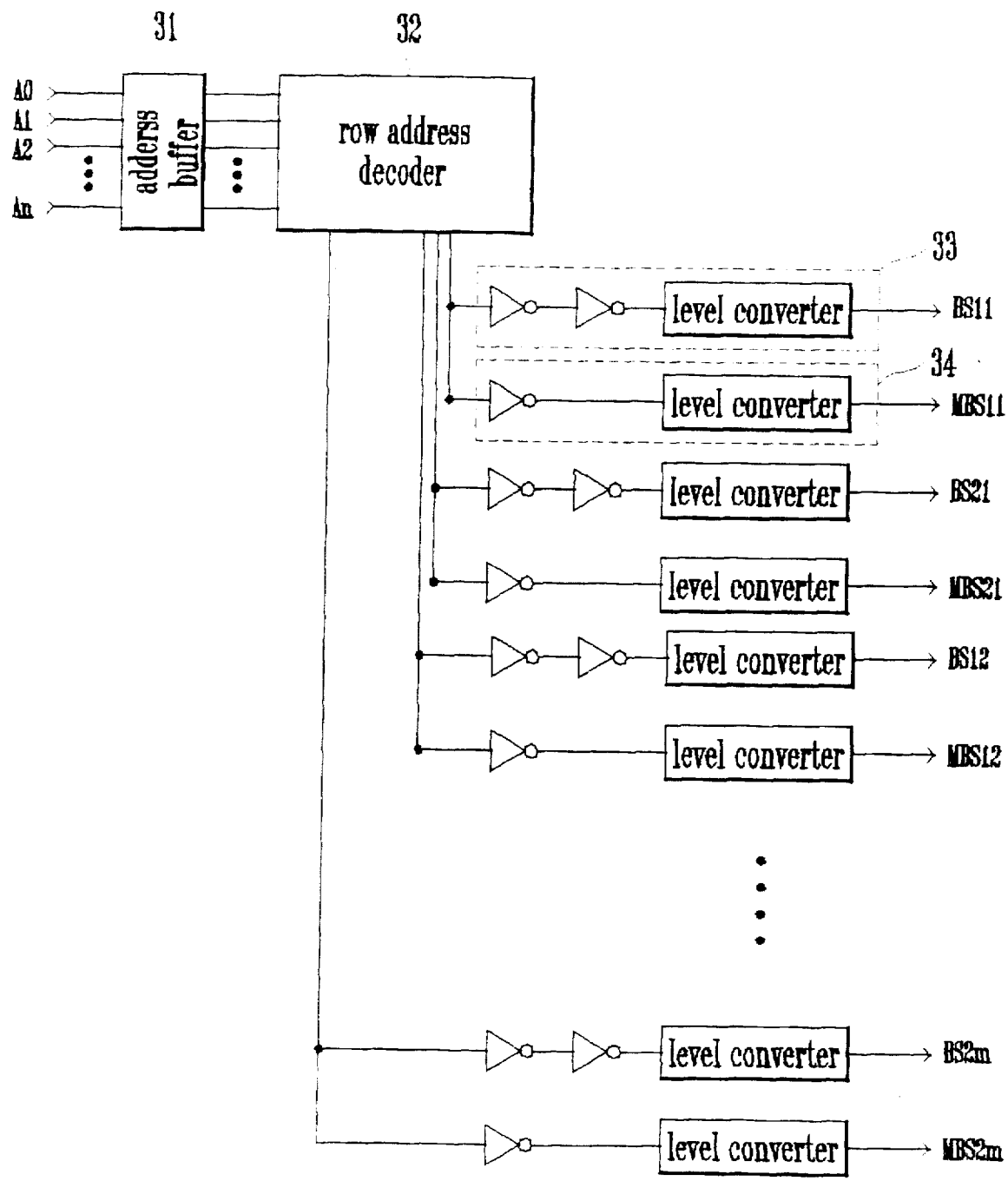
FIG. 6 is a diagram illustrating the generation of a block selection signal and a main bit line separation signal as shown in FIG. 5.

FIG. 5D is a detailed circuit diagram of the DRAM according to a first embodiment of the present invention which applies a folded bit line structure to the whole cell array of an open bit line structure. As shown in the drawing, block selection signals BS1$i$ and BS2$i$ (1≦i≦m) and main bit line separation signals MBS1$j$ and MBS2$j$ (1≦j≦m) coexist so as to control respective sub-bit lines at the same time. For simplification, a partial word line is shown in the drawing. FIG. 6 is a circuit diagram illustrating the generation of a block selection signal BSi and a main bit line separation signal MBSj as shown in FIG. 5, which comprises:

an address buffer 31 for buffering a received address as an address pin;

a low address decoder 32 for decoding the buffered address signal from the address buffer 31;

at least one block selection signal generator 33 for transmitting the output signal from the low address decoder 32 to the sub-bit line block selection switching means through two series-connected inverters and a level converter; and at least one main bit line separation signal generator 34 for transmitting an output block selection signal from the low address decoder 32 to the main bit line separation switching means through the series-connected inverters and a level converter.

In a read or a write operation, a low address is transferred from external address pins A0, A1, . . . and An to the address buffer 31 and then decoded by the low address decoder 32. In this process, the block selection signals BS1$i$ and BS2$i$ which connect the sub-bit line having a cell connected to a ward line with the main bit line is activated to 'Vpp' before the activation of the ward line. The other block selection signals BS1$j$ and BS2$j$ (1≦j≦m, j≠i) remain in a ground state, so that all the remaining sub-bit lines are separated from the main bit lines. The main bit-line separation signals MBS1$i$ and MBS2$i$ are generated by inverter signals of the block selection signals BS1$i$ and BS2$i$, respectively. Consequently, only the main bit line separation signals MBS1$i$ and MBS2$i$ from the activated block selection signals BS1$i$ and BS2$i$ change from 'Vpp' to 'Vss' and all the other main bit line separation signals MBS1$j$ and MBS2$j$ (1≦j≦m/2, j≠i) remain at 'Vpp', so that the main bit lines are divided into two parts. In the above circuit diagram, all the block selection signals BS1$i$ and BS2$i$ (1≦i≦m) and the main bit line separation signals MBS1$i$ and MBS2$i$ (1≦i≦m) are produced after passing the level converter (converting a 'high' signal, Vcc into Vpp) because they need a high voltage Vpp which is higher than an inner power voltage Vcc. If a low address changes, the output from a decoder will change. Thus, only the sub-bit lines having a cell connected to a ward line which will be addressed through this process can be connected to the main bit line and the main bit line is divided into two parts.

As described above, with the semiconductor memory device having a folded bit line structure according to the present invention, the number of cells connected to the bit lines is increased and the number of whole detect amplifiers is decreased, which may reduce the size of a chip so as to reduce the fabricating costs of the memory product. Additionally, the fabricating process of main bit lines can be simplified by increasing the main bit line pitch twice as much as the conventional folded bit line structure. Furthermore, power consumption can be reduced by decreasing the number of main bit lines by one half and dividing the respective main bit lines into two equal parts for the purpose of bi-directional use.

It will be apparent to those skilled in the art that various modifications and variations can be made in the semiconductor memory device of the present invention without departing from the spirit or scope of the invention. Thus, it is intended that the present invention cover the modifications and variations of this invention provided that they come within the scope of the appended claims and their equivalents.

What is claimed is:

1. A semiconductor memory device having a cell array of a folded bit line structure, comprising:

main bit lines and m sub-bit lines;

detect amplifiers connected to both ends of said main bit lines, respectively;

two sub-bit line block selection switching means for connecting the main bit line with respective sub-bit lines according to a block selection signal; and a main bit line separation switching means connected between the two sub-bit line block selection switching means, for dividing the main bit line into two parts according to a main bit line separation signal.

2. The semiconductor memory device defined as in claim 1, further comprising:

an address buffer means for buffering a received address as an address pin;

a low address decoder means for decoding the buffered address signal from the address buffer means;

at least two block selection signal generating means for transmitting the output signal from the low address decoder means to the sub-bit line block selection switching means through two series-connected inverters and a level converter; and at least one main bit line separation signal generating means for transmitting an output signal which is resulted from the two block selection signals of the low address decoder means as an NOR gate input to the main bit line separation switching means through the level converter.

3. The semiconductor memory device defined as in claim 1, wherein the sub-bit line block selection switching means is composed of an NMOS transistor.

4. The semiconductor memory device defined as in claim 1, wherein the main bit line separation switching means is composed of an NMOS transistor.

5. A semiconductor memory device having a cell array of a folded bit line structure, comprising:

main bit lines and m sub-bit lines;

detect amplifiers connected to both ends of said main bit lines, respectively;

two sub-bit line block selection switching means for connecting the main bit line with respective sub-bit lines according to a block selection signal; and two series-connected main bit line separation switching means connected between the two sub-bit line block selection switching means, for dividing the main bit line into two parts according to a main bit line separation signal.

6. The semiconductor memory device defined as in claim 5, wherein the main bit line separation switching means and the sub-bit line block selection switching means between the sub-bit lines are formed alternately.

7. The semiconductor memory device defined as in claim 5, further comprising:

an address buffer means for buffering a received address as an address pin;

a low address decoder means for decoding the buffered address signal from the address buffer means;

at least one block selection signal generating means for transmitting the output signal from the low address decoder means to the sub-bit line block selection switching means through two series-connected inverters and a level converter; and at least one main bit line separation signal generating means for transmitting an output block selection signal from the low address decoder means to the main bit line separation switching means through the series-connected inverters and a level converter.

* * * * *